United States Patent
Nakamura

(10) Patent No.: US 7,026,764 B2
(45) Date of Patent: Apr. 11, 2006

(54) PLASMA PRODUCING APPARATUS AND DOPING APPARATUS

(75) Inventor: Osamu Nakamura, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 54 days.

(21) Appl. No.: 10/390,882

(22) Filed: Mar. 19, 2003

(65) Prior Publication Data

US 2003/0184235 A1    Oct. 2, 2003

(30) Foreign Application Priority Data

Mar. 26, 2002  (JP) ............................. 2002-087233

(51) Int. Cl.
*H01J 7/24*    (2006.01)

(52) U.S. Cl. .................... 315/111.71; 315/111.81; 118/723 R

(58) Field of Classification Search ........... 315/111.71, 315/111.81, 111.91, 111.21, 111.31; 118/723 R, 118/723 VE, 723 MP, 723 E, 723 FE
See application file for complete search history.

(56) References Cited

U.S. PATENT DOCUMENTS

| | | | | |
|---|---|---|---|---|
| 5,003,178 A | * | 3/1991 | Livesay | 250/492.3 |
| 5,980,999 A | * | 11/1999 | Goto et al. | 427/572 |
| 6,149,775 A | * | 11/2000 | Tsuboi et al. | 204/173 |
| 6,329,229 B1 | * | 12/2001 | Yamazaki et al. | 438/166 |
| 6,672,926 B1 | * | 1/2004 | Liu et al. | 445/51 |
| 6,756,729 B1 | * | 6/2004 | Na et al. | 313/496 |
| 6,802,753 B1 | * | 10/2004 | Ando et al. | 445/6 |
| 2002/0006489 A1 | | 1/2002 | Goth et al. | 428/36.9 |
| 2002/0127351 A1 | * | 9/2002 | Takikawa et al. | 427/569 |
| 2002/0179428 A1 | * | 12/2002 | Anazawa et al. | 204/173 |
| 2004/0159638 A1 | * | 8/2004 | Demos et al. | 219/121.35 |

FOREIGN PATENT DOCUMENTS

| | | |
|---|---|---|
| JP | 04-047647 | 2/1992 |
| JP | 06-349433 | 12/1994 |
| JP | 07-105893 | 4/1995 |
| JP | 10-275695 | 10/1998 |
| JP | 2000-057934 | 2/2000 |
| JP | 2000-077005 | 3/2000 |
| JP | 2000-203819 | 7/2000 |
| JP | 2000-277003 | 10/2000 |
| JP | 2001-035351 | 2/2001 |
| JP | 2001-048512 | 2/2001 |
| JP | 2001-093403 | 4/2001 |
| JP | 2001-126609 | 5/2001 |
| JP | 2001-143894 | 5/2001 |
| JP | 2001-155620 | 6/2001 |

(Continued)

*Primary Examiner*—Trinh Vo Dinh
(74) *Attorney, Agent, or Firm*—Nixon Peabody LLP; Jeffrey L. Costelli

(57) ABSTRACT

An object of the present invention is to provide an apparatus for producing stable plasma. Another object of the present invention is to provide an apparatus having a long-lasting cathode electrode which is superior in field emission characteristic since the plasma density has to be raised in order to increase the throughput. The structure of the plasma producing apparatus of the present invention relates to a plasma producing apparatus with a plasma chamber surrounded by walls to make material gas into plasma, characterized in the plasma chamber has a cathode electrode, an anode electrode, means for introducing the material gas, and exhaust means, and that a carbon nano tube is formed on a surface of the cathode electrode and the anode electrode is formed on the surface of the cathode electrode.

56 Claims, 5 Drawing Sheets

FOREIGN PATENT DOCUMENTS

| | | | |
|---|---|---|---|
| JP | 2001-236876 | | 8/2001 |
| JP | 2001-261316 | * | 9/2001 |
| JP | 2001-261316 A | * | 9/2001 |
| JP | 2002-022899 | | 1/2002 |
| JP | 2002-025425 | | 1/2002 |
| JP | 2002-069643 | | 3/2002 |

* cited by examiner

PLASMA PRODUCING APPARATUS AND DOPING APPARATUS

BACKGROUND OF THE INVENTION

1. Field of the Invention

The present invention relates to an apparatus for producing plasma of high density, and to apparatus that uses the same. For example, the plasma producing apparatus is employed in a doping apparatus, etching apparatus, sputtering apparatus, and film forming apparatus.

2. Description of the Related Art

In recent years, manufacture of a transistor from a thin film (thin film transistor: TFT) has been widely researched. In manufacture of a TFT, film formation, etching, and ion introduction are some of indispensable processes and plasma is often utilized in these steps. To be specific, highly reactive ions or radicals are utilized in etching and film formation, particles having large kinetic energy are utilized in sputtering, and charged particles in plasma are utilized in etching and ion implantation. A TFT is manufactured through these steps using sputtering, plasma CVD, etching, ion doping, and the like.

There are several methods to produce plasma. One is to apply a uniform electric field between two planar electrodes that are set in parallel to each other (FIG. 4A, the electrode denoted by 51 is a cathode electrode and one denoted by 52 is an anode electrode). Another method is to use a directly-heated thermionic cathode electrode 53 and heat a high-melting point metal such as tungsten up to about 2500° C. to make the metal emit thermoelectrons (FIG. 4B). Still another method is indirect heating from the back using a substance having a small work function for a surface of a cathode electrode (FIG. 4C). Yet still another method is to produce plasma of high density using as a cathode electrode a cylindrical hollow electrode that is open at one end open and closed on the other end (hollow cathode discharge 54)(FIG. 4D). FIG. 4E shows a method of producing plasma by placing many permanent magnets along a wall of a plasma chamber and utilizing magnetic fields present on some parts of the wall surface (surface magnetic fields or multipolar magnetic fields). FIG. 4F shows a plasma producing method called magnetron discharge in which a magnetic field is applied in parallel to a planar cathode electrode face for electric discharge. These are examples of using direct current discharge but plasma can be produced also by alternating current discharge.

Major examples of producing plasma by alternating current are shown in FIGS. 5A to 5F. FIG. 5A shows a method called capacitively coupled plasma in which high frequency wave or microwave is applied to parallel planar electrodes. FIGS. 5B and 5C each show a method called inductively coupled plasma in which a high frequency current is let flow in a helical coil or a spiral coil. FIG. 5D shows a method called surface wave plasma in which surface wave is excited by irradiating electromagnetic wave onto high density plasma and is brought against intense microwave. FIG. 5E shows a method called ECR (electron cyclotron resonance) plasma which utilizes electron cyclotron resonance in a magnetic field. FIG. 5F shows a method called helicon wave plasma in which a high frequency current whose frequency is sufficiently lower than the electron cyclotron frequency is let flow in an antenna.

An ion doping apparatus is used mainly in manufacture of a thin film transistor (TFT) on a large-area glass substrate. In doping for forming a source region or a drain region, the dose necessary is on the order of $10^{15}$ ions/cm². In channel doping and doping for forming an LDD (lightly doped drain) region, the dose necessary is $1 \times 10^{12}$ to $1 \times 10^{14}$ ions/cm². Since the necessary dose in one type of regions is different from the dose needed in the other type of regions by three orders of magnitude, an ability to control high current density as well as low current density is required for an ion doping apparatus. For instance, an ion doping apparatus with a DC ion source using a filament is popular because the apparatus can handle a wide range of current density.

A problem of the ion doping apparatus with a DC ion source using a filament is that a filament has a short lifespan. Replacing a filament lowers the availability of the apparatus and reduces the throughput. In addition, it is desirable to replace a filament as less frequently as possible because many ion doping apparatuses use phosphine, diborane, and other harmful gas for material gas and it can contaminate a clean room and adversly affect human health. However, the lifespan of a filament is even shorter in the high dose treatment for forming a source region or a drain region because the ion coulomb density is increased in this treatment in order to raise the throughput. In addition, a filament that is long in use is gradually degraded and a film is adhered to the filament surface. These changes in a filament cause a change with time in field emission characteristic from the filament surface and a change in ion species ratio in plasma, thereby making stable dose control impossible. Stabilizing plasma is the most important objective not only in an ion doping apparatus but in every apparatus that deals with plasma.

SUMMARY OF THE INVENTION

The present invention has been made in view of the above, and an object of the present invention is therefore to provide an apparatus for producing stable plasma. Another object of the present invention is to provide an apparatus having a long-lasting cathode electrode which is superior in field emission characteristic since the plasma density has to be raised in order to increase the throughput.

The present invention is characterized in that carbon, in particular, a carbon nano tube (CNT) is used for a cathode electrode of a plasma producing apparatus, typically, a doping apparatus, etching apparatus, and film forming apparatus. A carbon nano tube is a carbon based material having a tubular graphite structure of 1 nm to several tens nm in diameter. There are various known carbon nano tube structures, including a single wall carbon nano tube (SWNT), a multi wall carbon nano tube (MWNT), a VGCF (vapor growth carbon fiber), a nano horn, and a nano glass fiber. Hereinafter, these are referred to by the generic term of carbon nano tube.

The shape of a carbon nano tube is characteristically thin and long. Despite being only several nm in diameter, a carbon nano tube can be as long as several thousands nm. Carbon nano tubes are extremely chemically stable since carbon atoms are bonded to one another very solidly. Some carbon nano tubes have conductivity and a large amount of current can flow in them because of the strong bond between carbon atoms. Furthermore, carbon nano tubes have excellent heat resistance.

If one end of a carbon nano tube is charged in advance, electrons are emitted from the tip of the carbon nano tube with a surprising frequency. This is supposedly due to the elongated shape of a carbon nano tube, in other words, its high aspect ratio. Accordingly, this field emission takes place at a lower voltage than when a usual metal is used, and causes almost no damage, which helps to prolong the lifespan.

Carbon nano tubes thus have excellent characteristics. The present invention is characterized in that the field emission characteristic of a carbon nano tube is used in a plasma producing source of an apparatus which utilizes plasma. By using a carbon nano tube as a cathode electrode that is set in an ion source, electrons can be supplied to an arc chamber with high efficiency. Because of electrons emitted from tips of a large number of carbon nano tubes, the plasma density in the ion source is increased. In addition, stable plasma can be obtained since carbon nano tubes are superior in heat resistance and current transporting characteristic.

The structure of the plasma producing apparatus of the present invention relates to a plasma producing apparatus with a plasma chamber surrounded by walls to make material gas into plasma, characterized in that the plasma chamber has a cathode electrode, an anode electrode, means for introducing the material gas, and exhaust means, and that a carbon nano tube is formed on a surface of the cathode electrode and the anode electrode is formed on the surface of the cathode electrode.

The above structure is characterized in that the carbon nano tube is one or more kinds selected from the group consisting of a single wall carbon nano tube, a multi wall carbon nano tube, a VGCF, a carbon nano horn, and nano glass fiber.

The above structure is characterized in that the carbon nano tube is manufactured by arc discharge or laser irradiation and bonded to a metal member with a conductive paste. Alternatively, the above structure is characterized in that the carbon nano tube is manufactured through deposition on a metal member by a vapor phase method, preferably, plasma CVD, using as introduction gas methane, ethane, ethylene, acetylene, or a mixture thereof, namely, hydrocarbon-based gas and hydrogen gas.

When plasma is thus produced using the cathode electrode where carbon nano tubes are formed, high density plasma can be obtained efficiently. In addition, superior heat resistance and current transporting characteristic of carbon nano tubes make it possible to produce stable plasma in an ion source. Then, an ion doping apparatus, etching apparatus, sputter apparatus, and film forming apparatus each having such a cathode electrode can be used to perform a variety of stable processes on a semiconductor film.

DETAILED DESCRIPTION OF THE PREFERRED EMBODIMENTS

Embodiment Mode 1

Figure 1:
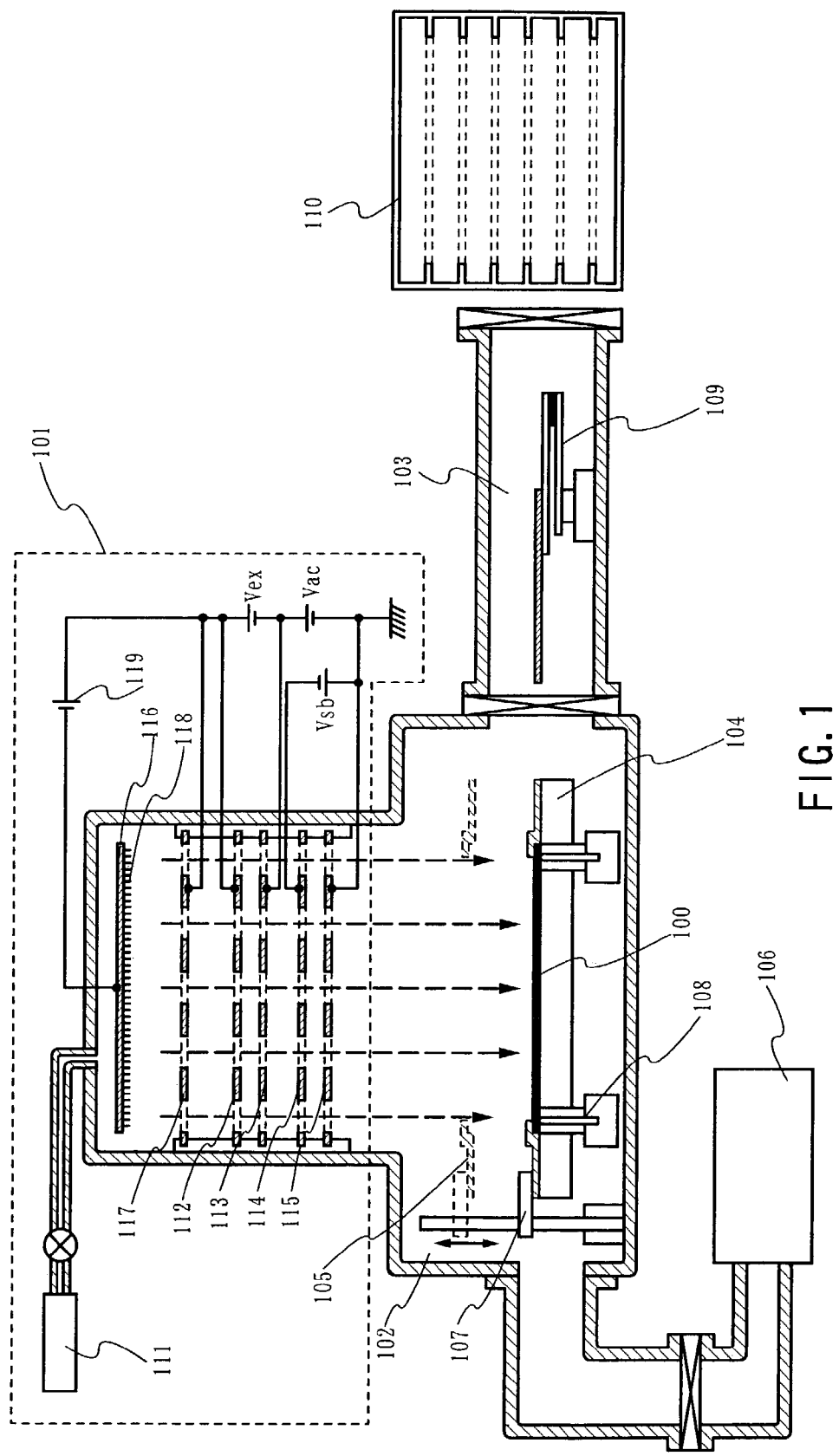
FIG. 1 is a diagram showing an example of the present invention.

This embodiment describes with reference to FIG. 1 a plasma producing apparatus having a cathode electrode and an anode electrode.

FIG. 1 shows an example of a plasma producing apparatus of the present invention. In FIG. 1, a chamber is equipped with a plasma chamber 101, a processing chamber 102, a load lock chamber 103, vacuum exhaust means 106, a gas supplying system 111, a cathode electrode 116 for producing plasma, and an anode electrode 117. The structure in FIG. 1 conforms to the capacitively coupled high frequency electric discharge format. Instead, a filament type electrode may be used.

A carbon nano tube 118 to serve as an electron emission source is formed on a metal member of the cathode electrode 116. The carbon nano tube 118 is manufactured by arc discharge or laser irradiation to graphite and refined before being bonded to the metal member with a conductive paste. In particular, a carbon nano tube obtained by arc discharge has excellent crystallinity and few defects.

Alternatively, a carbon nano tube may be formed by direct deposition on the metal member using a vapor phase method. Plasma CVD, preferably, electric field-applied plasma CVD, is employed and methane, ethane, ethylene, acetylene, or a mixture thereof, namely, hydro carbon-based gas and hydrogen gas, are used as introduction gas to let a carbon nano tube grow directly on the metal member. An auxiliary agent is desirably used in forming a carbon nano tube by deposition, and the agent is, for example, Ni, Fe, or Co, or an alloy of two or more chosen from Ni, Fe, and Co. The auxiliary agent is applied by sputtering, plating, baking after application of an organometallic compound, or other methods.

With such vapor phase methods, the direction in which a carbon nano tube grows can be set perpendicular to the metal member. This directs the tip of the carbon nano tube upward and therefore the field emission characteristic thereof is improved. Furthermore, by directing the growth of the carbon nano tube, the carbon nano tube density per area can be increased and therefore high density plasma is obtained.

The anode electrode 117 is a grid electrode, which is placed not far from the cathode electrode 116 in order to apply a voltage effectively. Electrons emitted from the carbon nano tube 118 pass through grid holes of the anode electrode 117, collide with material gas in the chamber, and ionize the material gas. When the grid holes have a small diameter, ions and neutral molecules in the chamber are prevented from reaching the cathode electrode 116. Desirably, the pressure in the chamber upon introduction of material gas is $1 \times 10^{-1}$ to $1 \times 10^{-3}$ Pa.

Plasma produced by such a plasma producing apparatus that has the cathode electrode 116 and the anode electrode 117 has high density and is stable.

Embodiment Mode 2

Figure 2A:
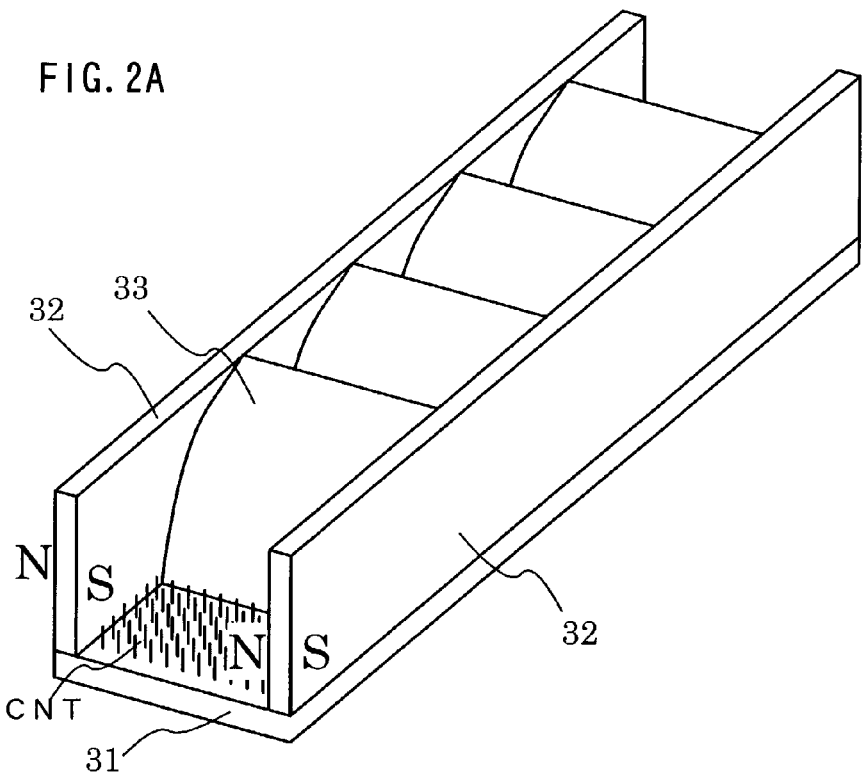
FIGS. 2A and 2B are diagrams each showing an example of the present invention.
Figure 2B:
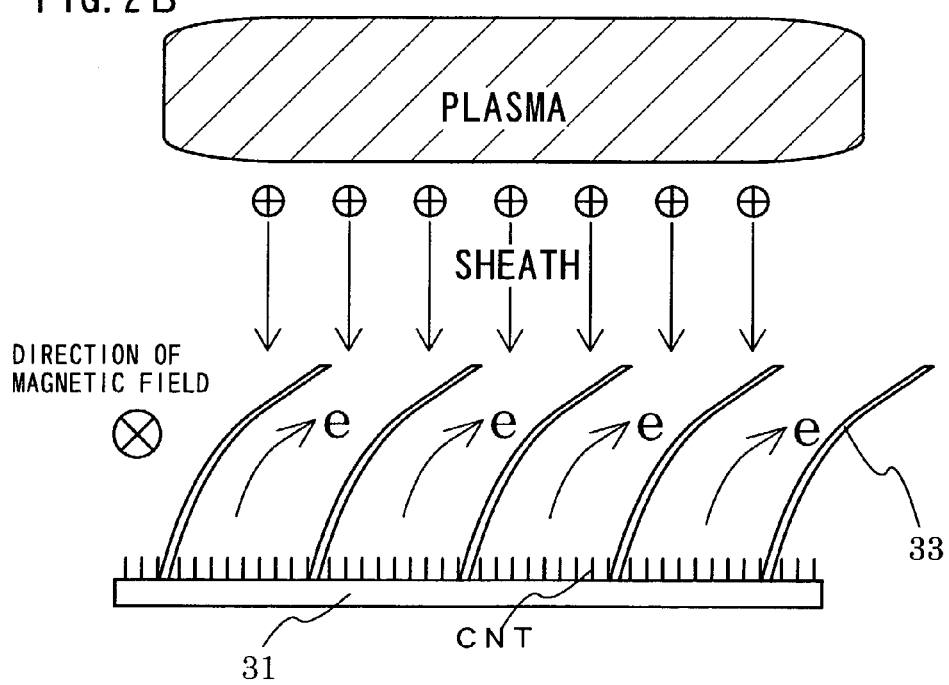

This embodiment describes with reference to FIGS. 2A and 2B a cathode electrode structure different from the one in Embodiment Mode 1. FIG. 2A is a bird's-eye view and FIG. 2B shows a section perpendicular to a magnetic field that is formed in parallel to a cathode electrode.

A cathode electrode 31 is composed of a metal member and a carbon nano tube formed on a surface of the metal member. Similar to Embodiment Mode 1, the carbon nano tube is manufactured by arc discharge or laser irradiation and refined before being bonded to the metal member with a conductive paste. Alternatively, the carbon nano tube is obtained through vapor phase growth directly on the metal member using plasma CVD.

A plate-like or rod-like magnet 32 is placed on each side of the cathode electrode 31 in a manner that makes the north pole and the south pole face each other. A plurality of blocking plates 33 are placed between the magnet 32 and the other magnet 32. The blocking plates 33 are each formed of a metal material or an insulating material, and are slanted with respect to a sheath electric field that is formed between the cathode electrode and plasma. The inclination is determined by the voltage between the cathode electrode 31 and an anode electrode, the magnetic force of the magnet 32, the distance between one magnet 32 and the other magnet 32, and the field emission characteristic of the carbon nano tube.

When a voltage is applied between the cathode electrode 31 and the anode electrode, electrons are emitted from the carbon nano tube and the orbits of the electrons are bent by a magnetic field created by one magnet 32 and the other magnet 32. The blocking plates 33 are slanted at an angle that can avoid collision between electrons whose orbits have been bent and the blocking plates 33. The shape of the blocking plates 33 desirably possesses a curvature. However, the blocking plates 33 may instead be planar.

Positive ions in plasma are accelerated by the sheath electric field formed between the cathode electrode 31 and plasma. Of these positive ions, ones having a large Larmor radius collide against the blocking plates 33 because their orbits are not bent by the magnetic field. The positive ions are thus prevented from colliding with the carbon nano tube releasing high energy. If points of collision between the positive ions and the blocking plates 33 are formed of BaO, LaB6, or others that readily emit secondary electrons, plasma can effectively be replenished with electrons.

Plasma produced by such a plasma producing apparatus that has the cathode electrode 31 and the anode electrode 32 has high density and is stable.

This embodiment mode can be combined with Embodiment Mode 1.

Embodiment 1

This embodiment describes the present invention by taking a doping apparatus as an example and referring to FIG. 1.

Major components of the doping apparatus of FIG. 1 are an ion source 101, a processing chamber 102, a load lock chamber 103, and vacuum exhaust means 106. The processing chamber 102 is a place where a substrate is held and ions are implanted, and the chamber is provided with a substrate stage 104 and a damper 105. A pin 108 for moving a substrate up and down on the substrate stage is used when a substrate is put on the substrate stage 104 by transporting means 109 after the transporting means brings the substrate from the load lock chamber 103. The damper 105 is moved up and down by an arm 107 as the substrate is brought in and out.

With the clamper 105 lifted above the substrate stage by the arm 107, a substrate is brought in by the transporting means 109. At this point, the pin 108 is jetting out from the substrate stage 104 and a substrate 100 is placed on the pin 108. Thereafter, the pin 108 is lowered and then the arm 107 is lowered to enable the damper 105 to fix the substrate 100 to the substrate stage.

The exhaust means 106 is a combination of a dry pump, a mechanical booster pump, a turbomolecular pump, and the like.

The ion source 101 has a gas supplying system 111 for supplying material gas, a cathode electrode 116 for producing plasma, and an anode electrode 117. The structure in FIG. 1 conforms to the capacitively coupled high frequency electric discharge format. Other electrodes may be used instead.

A carbon nano tube 118 to serve as an electron emission source is formed on a metal member of the cathode electrode 116. The carbon nano tube 118 is manufactured by arc discharge or laser irradiation to graphite and refined before being bonded to the metal member with a conductive paste. In particular, a carbon nano tube obtained by arc discharge has excellent crystallinity and few defects.

When a voltage is applied between the cathode electrode 116 and the anode electrode 117, electrons are emitted from the carbon nano tube 118 formed on the surface of the cathode electrode and collide with molecules of material gas supplied from the gas supplying system 111. Plasma is thus produced.

Plasma produced by such a plasma producing apparatus that has the cathode electrode 116 and the anode electrode 117 has high density and is stable.

The apparatus also has as a lead-out electrode system a lead-out electrode 112, an acceleration electrode 113, a suppression electrode 114, and a ground electrode 115. These electrodes have many openings through which ions pass. Ions are accelerated by the lead-out electrode 112 to which a lead-out voltage Vex is applied and by the acceleration electrode 113 to which an acceleration voltage Vac is applied. The suppression electrode 114 catches and gathers scattering ions in order to increase the directivity of the ion flow. 10 kV is applied as the lead-out voltage Vex to change the acceleration voltage Vac. In this way, ions are accelerated with an energy of 50 to 100 keV.

The material gas used is $PH_3$, $B_2H_6$, or the like, and is diluted down to 0.1 to 30% with hydrogen or inert gas. When $PH_3$ is used, $PH_x^+$, $P2H_x^+$, $H_x^+$, and the like are generated as ion species and, if there is no mass separation, these ions are accelerated by the lead-out electrode system and led out to the processing chamber where the substrate is set. As indicated by the arrow in FIG. 1, the ions are led out mostly linearly by the four electrodes and are thrown to the substrate.

In this embodiment, plasma produced is stable and therefore ions can be introduced to the substrate 100 evenly. In addition, CNTs are formed on the cathode electrode 116 to prolong the lifespan of the cathode 116.

Embodiment 2

Figure 3:
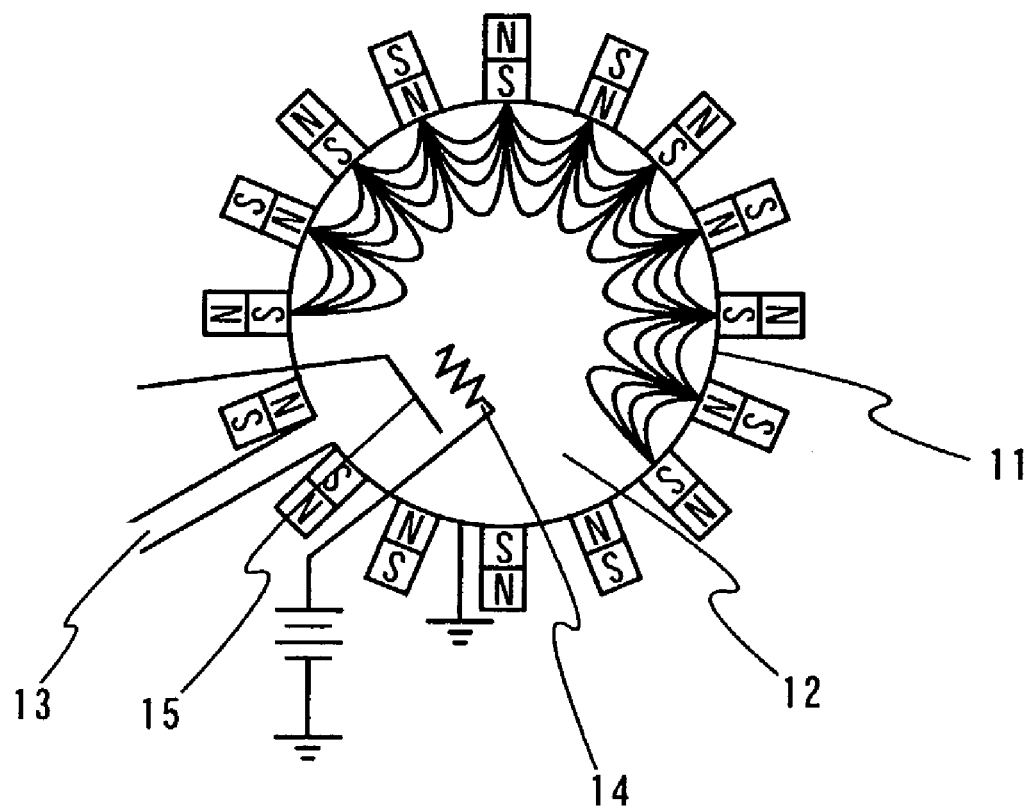
FIG. 3 is a diagram showing an example of an ion source that uses the present invention.
Figure 4A:
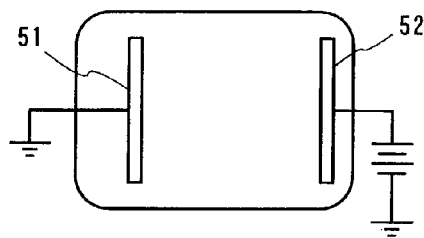
FIGS. 4A to 4F are diagrams showing examples of direct current discharge.
Figure 4B:
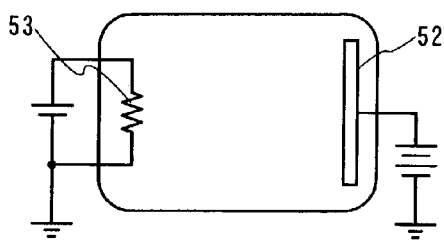
Figure 4C:
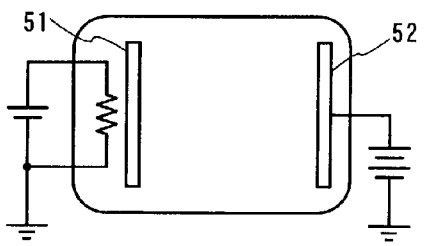
Figure 4D:
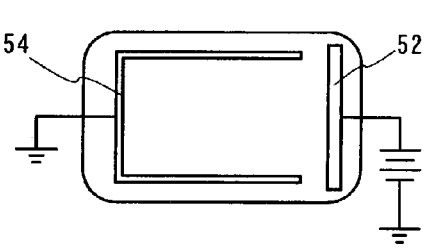
Figure 4E:
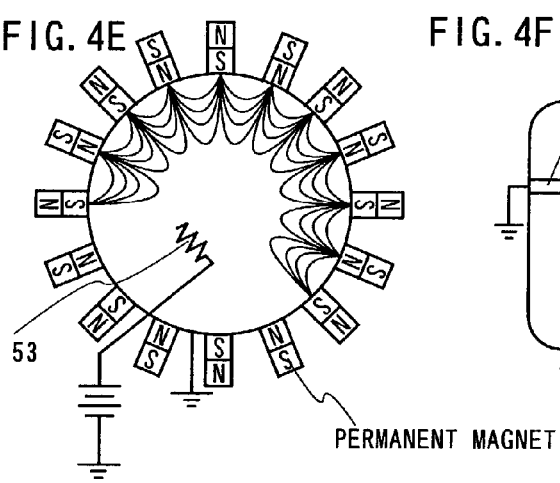
Figure 4F:
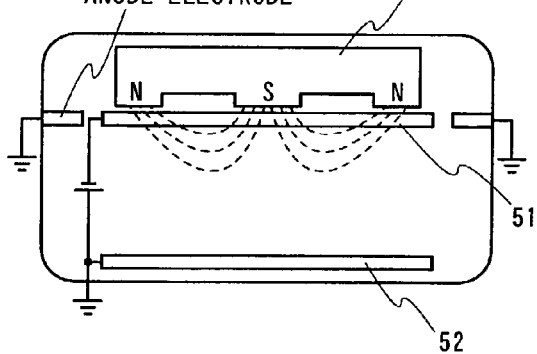
Figure 5A:
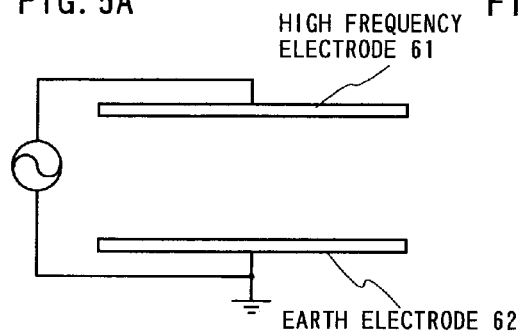
FIGS. 5A to 5F are diagrams showing examples of alternating current discharge.
Figure 5B:
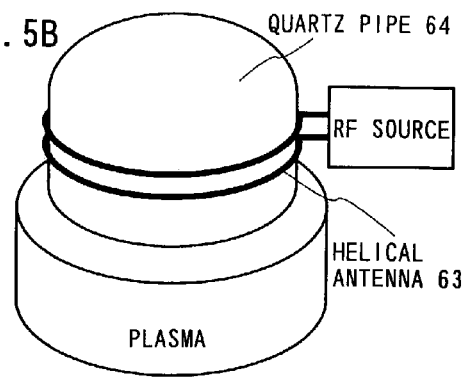
Figure 5C:
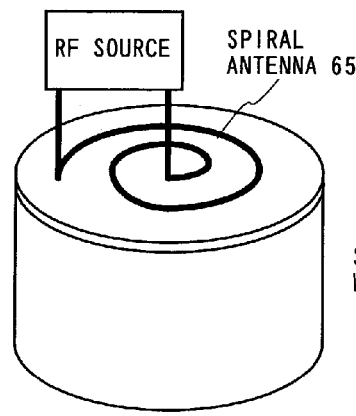
Figure 5D:
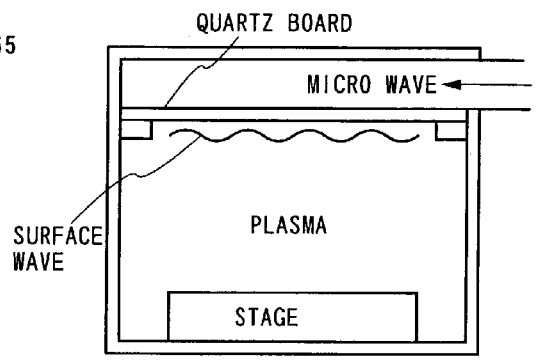
Figure 5E:
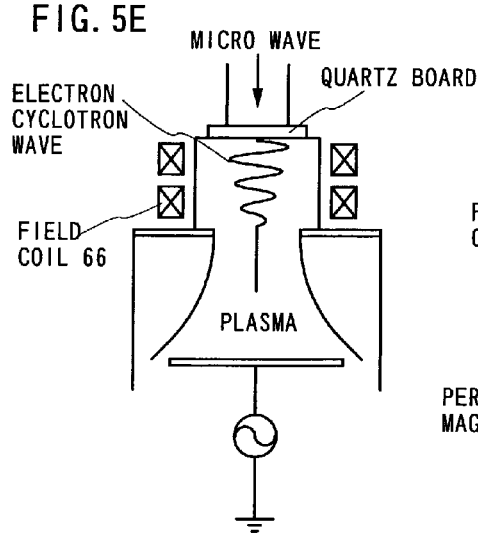
Figure 5F:
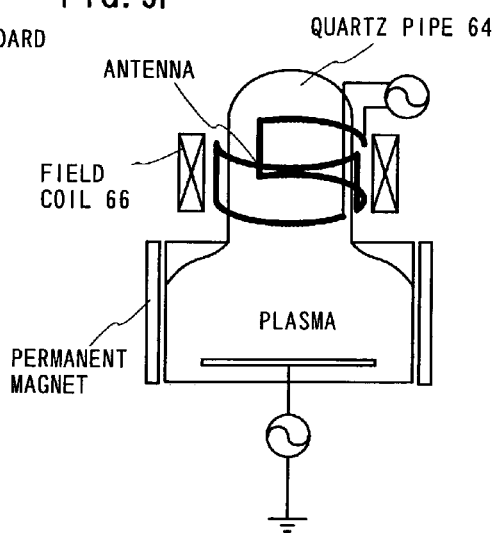

This embodiment describes the present invention by taking an ion source as an example and referring to FIG. 3.

An ion source has a wall 11 and an arc chamber (plasma chamber) 12 constituted of the wall 11. Semiconductor material gas such as phosphine or diborane is introduced from an inlet 13. A cathode electrode 14 and an anode electrode 15 are set in the arc chamber 12. A carbon nano structure such as a single wall carbon nano tube (SWNT), a multi wall carbon nano tube (MWNT), a VGCF (vapor growth carbon fiber), a nano horn, or a nano glass fiber is used for the cathode electrode 14.

A voltage is applied between the cathode electrode 14 and the anode electrode 15 by an external power source. As a result, high energy electrons are emitted from the cathode electrode 14 and collide with molecules of the material gas introduced through the inlet 13 to produce high density plasma. In an ion doping apparatus, ions are led out of this plasma by a lead-out electrode. Then an acceleration electrode accelerates the ions until an arbitrary energy is reached and the ions are implanted to a given semiconductor substrate.

The north poles and the south poles of rod-like magnets are placed alternately along the periphery of the wall 11 to form a magnetic field called line cusp, thereby raising the plasma density at the center of the arc chamber 12 and uniformizing the plasma density distribution. In the case of a large capacity ion source for a large-area substrate, it is desirable to place more than one cathode electrode 14 in the arc chamber 12.

When plasma is thus produced using the cathode electrode 14 where carbon nano tubes are formed, high density plasma can be obtained efficiently. In addition, superior heat resistance and current transporting characteristic of carbon nano tubes make it possible to produce stable plasma in an ion source. If such an ion doping apparatus having the cathode electrode is used to introduce impurity elements into a semiconductor film, the treatment of the film is stable and therefore the yield of a semiconductor device can be improved.

This embodiment may be combined with Embodiment 1.

By employing the structure of the present invention, the lifespan of a cathode electrode can be prolonged. Accordingly, the number of times to replace cathode electrodes is greatly reduced. This lowers the possibilities of contaminating a clean room and adversly affecting human health as well as cost.

The present invention also makes it possible to produce high density plasma that is stable. This means that steps that use plasma, such as film formation, etching, and ion introduction, can be stabilized. Moreover, a semiconductor device manufactured through these steps can be improved in yield.

What is claimed is:

1. A plasma producing apparatus with a plasma chamber surrounded by walls to generate a plasma from a material gas, the plasma chamber comprising:
    a cathode electrode, an anode electrode having a plurality of openings, means for introducing the material gas, exhaust means, a substrate stage, a carbon nano tube on a surface of the cathode electrode, and a blocking plate on the surface of the cathode electrode,
    wherein the anode electrode is located between the cathode electrode and the substrate stage,
    wherein the plasma is introduced to a substrate over the substrate stage through the plurality of openings, and
    wherein the blocking plate is slanted with respect to the surface of the cathode electrode.

2. The plasma producing apparatus according to claim 1, wherein the carbon nano tube is formed on the surface of the cathode electrode with a vapor phase epitaxy.

3. The plasma producing apparatus according to claim 1, wherein the carbon nano tube is one or more kinds selected from the group consisting of a single wall carbon nano tube, a multi wall carbon nano tube, a VGCF, a carbon nano horn, and nano glass fiber.

4. The doping apparatus using a plasma producing apparatus of claim 1.

5. The plasma producing apparatus according to claim 1, wherein the anode electrode is a grid electrode.

6. The plasma producing apparatus according to claim 1, further comprising a lead-out electrode between the anode electrode and the substrate.

7. The plasma producing apparatus according to claim 6, further comprising an acceleration electrode between the lead-out electrode and the substrate.

8. The plasma producing apparatus according to claim 1, wherein the blocking plate is slanted at an angle that can avoid collision between an electron emitted from the carbon nano tube and the blocking plate.

9. The plasma producing apparatus according to claim 1, wherein the blocking plate has a curvature.

10. A plasma producing apparatus with a plasma chamber surrounded by walls to generate a plasma from a material gas, the plasma chamber comprising:
    a cathode electrode, an anode electrode having a plurality of openings, means for introducing the material gas, exhaust means, means for forming a magnetic field, a substrate stage, a carbon nano tube on a surface of the cathode electrode, and a blocking plate for protecting the carbon nano tube on the surface of the cathode electrode,
    wherein the anode electrode is located between the cathode electrode and the substrate stage,
    wherein the plasma is introduced to a substrate over the substrate stage through the plurality of openings, and
    wherein the blocking plate is slanted with respect to the surface of the cathode electrode.

11. The plasma producing apparatus according to claim 10, wherein the carbon nano tube is formed on the surface of the cathode electrode with a vapor phase epitaxy.

12. The plasma producing apparatus according to claim 10, wherein the blocking plate for protecting the carbon nano tube blocks positive ions accelerated by a sheath electric field formed between the cathode electrode and the plasma.

13. The plasma producing apparatus according to claim 10, wherein the blocking plate for protecting the carbon nano tube is formed of a conductive material or an insulating material.

14. The plasma producing apparatus according to claim 10, wherein the carbon nano tube is one or more kinds selected from the group consisting of a single wall carbon nano tube, a multi wall carbon nano tube, a VGCF, a carbon nano horn, and nano glass fiber.

15. The doping apparatus using a plasma producing apparatus of claim 10.

16. The plasma producing apparatus according to claim 10, wherein the anode electrode is a grid electrode.

17. The plasma producing apparatus according to claim 10, further comprising a lead-out electrode between the anode electrode and the substrate.

18. The plasma producing apparatus according to claim 17, further comprising an acceleration electrode between the lead-out electrode and the substrate.

19. The plasma producing apparatus according to claim 10, wherein the blocking plate is slanted at an angle that can avoid collision between an electron emitted from the carbon nano tube and the blocking plate.

20. The plasma producing apparatus according to claim 10, wherein the blocking plate has a curvature.

21. A doping apparatus having a plasma chamber, the plasma chamber comprising:
    a substrate stage on which a substrate is provided;
        a cathode electrode having a carbon nano tube and a blocking plate on the surface thereof;
    an anode electrode having a plurality of openings;
    means for introducing a material gas; and
    exhaust means
    wherein the anode electrode is located between the cathode electrode and the substrate stage,
    wherein a plasma is generated from the material gas in the plasma chamber by applying voltage to the cathode electrode and the anode electrode so as the plasma is introduced to the substrate through the plurality of openings, and
    wherein the blocking plate is slanted with respect to the surface of the cathode electrode.

22. The doping apparatus according to claim 21, wherein the carbon nano tube is formed on the surface of the cathode electrode with a vapor phase epitaxy.

23. The doping apparatus according to claim 21, wherein the carbon nano tube is one or more kinds selected from the group consisting of a single wall carbon nano tube, a multi wall carbon nano tube, a VGCF, a carbon nano horn, and nano glass fiber.

24. The doping apparatus according to claim 21, wherein the anode electrode is a grid electrode.

25. The doping apparatus according to claim 21, further comprising a lead-out electrode between the anode electrode and the substrate.

26. The doping apparatus according to claim 25, further comprising an acceleration electrode between the lead-out electrode and the substrate.

27. The doping apparatus according to claim 21, wherein the blocking plate is slanted at an angle that can avoid collision between an electron emitted from the carbon nano tube and the blocking plate.

28. The doping apparatus according to claim 21, wherein the blocking plate has a curvature.

29. A doping apparatus having a plasma chamber, the plasma chamber comprising:
   a substrate stage on which a substrate is provided;
   a cathode electrode;
   an anode electrode having a plurality of openings;
   means for introducing a material gas;
   exhaust means;
   means for forming a magnetic field; and
   a carbon nano tube and a blocking plate for protecting the carbon nano tube on a surface of the cathode electrode.
   wherein the anode electrode is located between the cathode electrode and the substrate stage,
   wherein a plasma is generated from the material gas in the plasma chamber by applying voltage to the cathode electrode and the anode electrode so as the plasma is introduced to the substrate through the plurality of openings, and
   wherein the blocking plate is slanted with respect to the surface of the cathode electrode.

30. The doping apparatus according to claim 29, wherein the carbon nano tube is formed on the surface of the cathode electrode with a vapor phase epitaxy.

31. The doping apparatus according to claim 29, wherein the carbon nano tube is one or more kinds selected from the group consisting of a single wall carbon nano tube, a multi wall carbon nano tube, a VGCF, a carbon nano horn, and nano glass fiber.

32. The doping apparatus according to claim 29, wherein the blocking plate for protecting the carbon nano tube blocks positive ions accelerated by a sheath electric field formed between the cathode electrode and the plasma.

33. The doping apparatus according to claim 29, wherein the blocking plate for protecting the carbon nano tube is formed of a conductive material or an insulating material.

34. The doping apparatus according to claim 29, wherein the anode electrode is a grid electrode.

35. The doping apparatus according to claim 29, further comprising a lead-out electrode between the anode electrode and the substrate.

36. The doping apparatus according to claim 35, further comprising an acceleration electrode between the lead-out electrode and the substrate.

37. The doping apparatus according to claim 29, wherein the blocking plate is slanted at an angle that can avoid collision between an electron emitted from the carbon nano tube and the blocking plate.

38. The doping apparatus according to claim 14, wherein the blocking plate has a curvature.

39. An etching apparatus having a plasma chamber, the plasma chamber comprising:
   a substrate stage on which a substrate is provided;
   a cathode electrode having a carbon nano tube and a blocking plate on a surface thereof;
   an anode electrode having a plurality of openings;
   means for introducing a material gas; and
   exhaust means,
   wherein the anode electrode is located between the cathode electrode and the substrate stage,
   wherein a plasma is generated from the material gas in the plasma chamber by applying voltage to the cathode electrode and the anode electrode so as the plasma is introduced to the substrate through the plurality of openings, and
   wherein the blocking plate is slanted with respect to the surface of the cathode electrode.

40. The etching apparatus according to claim 39, wherein the carbon nano tube is formed on the surface of the cathode electrode with a vapor phase epitaxy.

41. The etching apparatus according to claim 39, wherein the carbon nano tube is one or more kinds selected from the group consisting of a single wall carbon nano tube, a multi wall carbon nano tube, a VGCF, a carbon nano horn, and nano glass fiber.

42. The etching apparatus according to claim 39, wherein the anode electrode is a grid electrode.

43. The etching apparatus according to claim 39, further comprising a lead-out electrode between the anode electrode and the substrate.

44. The etching apparatus according to claim 43, further comprising an acceleration electrode between the lead-out electrode and the substrate.

45. The etching apparatus according to claim 39, wherein the blocking plate is slanted at an angle that can avoid collision between an electron emitted from the carbon nano tube and the blocking plate.

46. The etching apparatus according to claim 39, wherein the blocking plate has a curvature.

47. An etching apparatus having a plasma chamber, the plasma chamber comprising:
   a substrate stage on which a substrate is provided;
   a cathode electrode;
   an anode electrode having a plurality of openings;
   means for introducing a material gas;
   exhaust means;
   means for forming a magnetic field; and
   a carbon nano tube and a blocking plate for protecting the carbon nano tube on a surface of the cathode electrode,
   wherein the anode electrode is located between the cathode electrode and the substrate stage,
   wherein a plasma is generated from the material gas in the plasma chamber by applying voltage to the cathode electrode and the anode electrode so as the plasma is introduced to the substrate through the plurality of openings, and
   wherein the blocking plate is slanted with respect to the surface of the cathode electrode.

48. The etching apparatus according to claim 47, wherein the carbon nano tube is formed on the surface of the cathode electrode with a vapor phase epitaxy.

49. The etching apparatus according to claim 47, wherein the carbon nano tube is one or more kinds selected from the group consisting of a single wall carbon nano tube, a multi wall carbon nano tube, a VGCF, a carbon nano horn, and nano glass fiber.

50. The etching apparatus according to claim 47, wherein the blocking plate for protecting the carbon nano tube blocks positive ions accelerated by a sheath electric field formed between the cathode electrode and the plasma.

51. The etching apparatus according to claim 47, wherein the blocking plate for protecting the carbon nano tube is formed of a conductive material or an insulating material.

52. The etching apparatus according to claim 47, wherein the anode electrode is a grid electrode.

53. The etching apparatus according to claim 47, further comprising a lead-out electrode between the anode electrode and the substrate.

54. The etching apparatus according to claim 53, further comprising an acceleration electrode between the lead-out electrode and the substrate.

55. The etching apparatus according to claim 47, wherein the blocking plate is slanted at an angle that can avoid collision between an electron emitted from the carbon nano tube and the blocking plate.

56. The etching apparatus according to claim 47, wherein the blocking plate has a curvature.

* * * * *